United States Patent [19]
Coberly et al.

[11] Patent Number: 4,736,760
[45] Date of Patent: Apr. 12, 1988

[54] APPARATUS FOR CLEANING, RINSING AND DRYING SUBSTRATES

[75] Inventors: Robert A. Coberly, 8006 Thoroughbred St., Alta Loma, Calif. 91701; Mark J. Beck, Cucamonga; Dan S. Azlin, Brea, both of Calif.; Karl J. Gifford, Nashville, Tenn.

[73] Assignee: Robert A. Coberly, Alta Loma, Calif.

[21] Appl. No.: 907,249

[22] Filed: Sep. 15, 1986

Related U.S. Application Data

[62] Division of Ser. No. 832,506, Feb. 21, 1986, abandoned.

[51] Int. Cl.$^4$ .............................................. B08B 3/12
[52] U.S. Cl. ................................. 134/134; 134/147; 134/165; 134/184
[58] Field of Search .................. 134/1, 61, 62, 66, 77, 134/79, 83, 86, 89, 134, 135, 140, 147, 153, 155, 159, 165, 184, 186, 137, 157

[56] References Cited

U.S. PATENT DOCUMENTS

| | | | |
|---|---|---|---|
| 519,091 | 5/1894 | Noble | 134/77 X |
| 2,329,787 | 9/1943 | Romano | 134/157 X |
| 2,985,003 | 5/1961 | Gelfand et al. | 68/3 SS |
| 3,050,422 | 8/1962 | Zak | 134/1 |
| 3,640,295 | 2/1972 | Peterson | 134/159 |
| 3,893,869 | 7/1975 | Mayer et al. | 134/184 X |
| 3,896,829 | 7/1975 | Sabatka | 134/135 X |
| 3,966,408 | 6/1976 | Drennen et al. | 134/135 X |
| 4,112,452 | 9/1978 | Patton | 134/79 X |
| 4,252,430 | 2/1981 | Michal | 134/79 X |
| 4,543,130 | 9/1985 | Shwartzman | 134/1 |

FOREIGN PATENT DOCUMENTS

| | | | |
|---|---|---|---|
| 26242 | 11/1965 | Japan | 134/79 |
| 7105 | 3/1971 | Japan | 134/184 |
| 400009 | 4/1966 | Switzerland | 134/83 |
| 734137 | 7/1955 | United Kingdom | 134/66 |

Primary Examiner—Philip R. Coe
Attorney, Agent, or Firm—Townsend & Townsend

[57] ABSTRACT

Apparatus and a method for cleaning, rinsing and drying substrates, such as semiconductor wafers. The apparatus has a cleaning tank in which one or more megasonic transducers are located, the transducers being adapted to direct megasonic energy past the substrates for cleaning the same. The substrates are held in the cleaning tank by an improved holder which can be pivoted from one side to the other to present opposite side margins of the substrates to the megasonic energy field when otherwise such opposite side margins would not be exposed to such energy field due to the blocking action of parts of the holder. A rinse tank for containing a rinse solution is adjacent to the cleaning tank, and a robotic transfer arm mechanism moves the substrates in the holder from the cleaning tank to the rinse tank for immersion of the substrates into the rinse solution which can be heated to an elevated temperature or can be at ambient temperature. By removing the substrates from the rinse solution at a slow, controlled rate by the robotic arm mechanism, the substrates can emerge from the rinse solution in a dry state to thereby avoid the need for a dryer independent of the rinse tank.

7 Claims, 7 Drawing Sheets

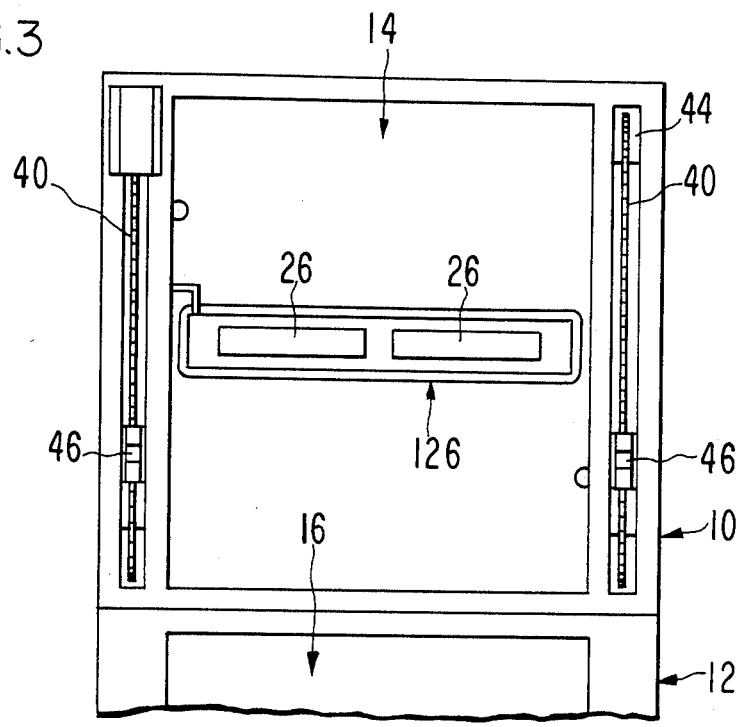
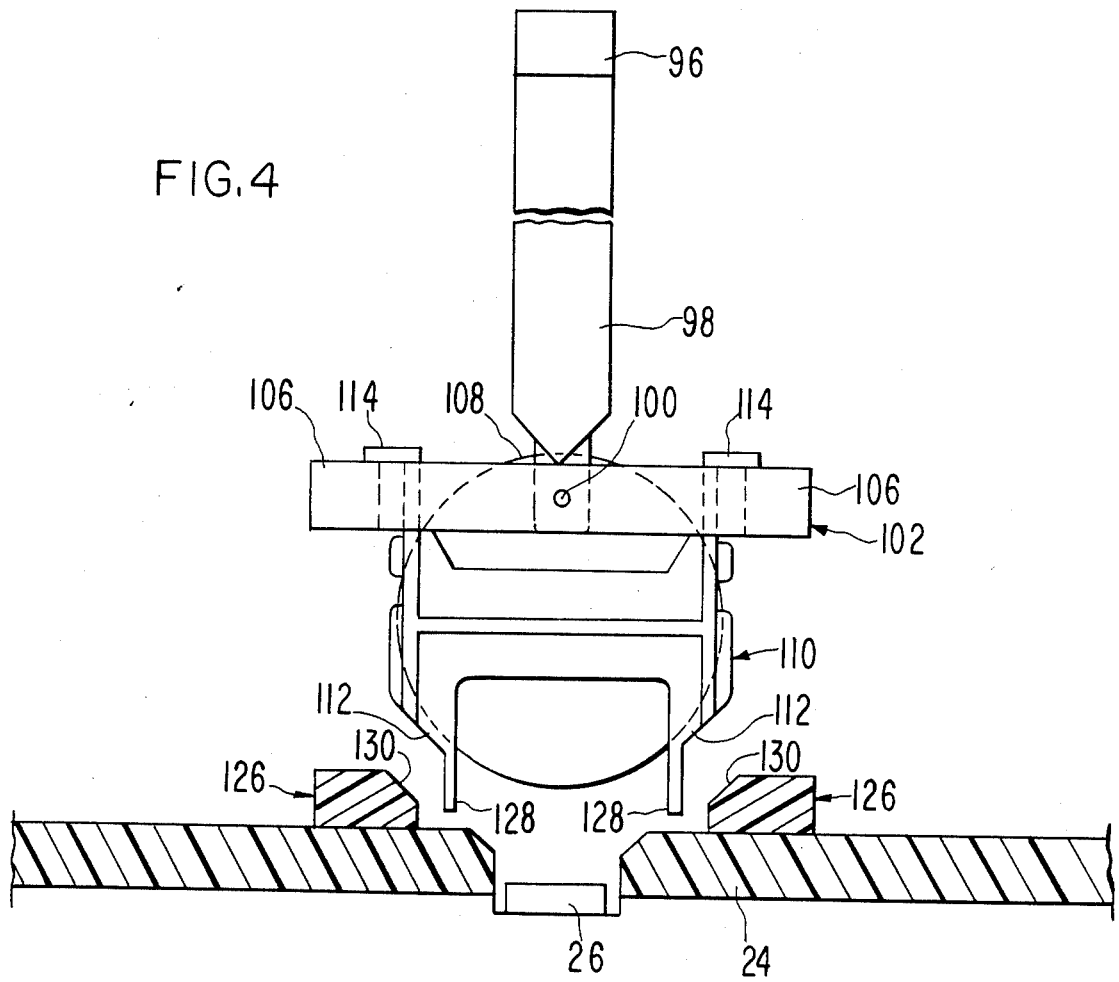

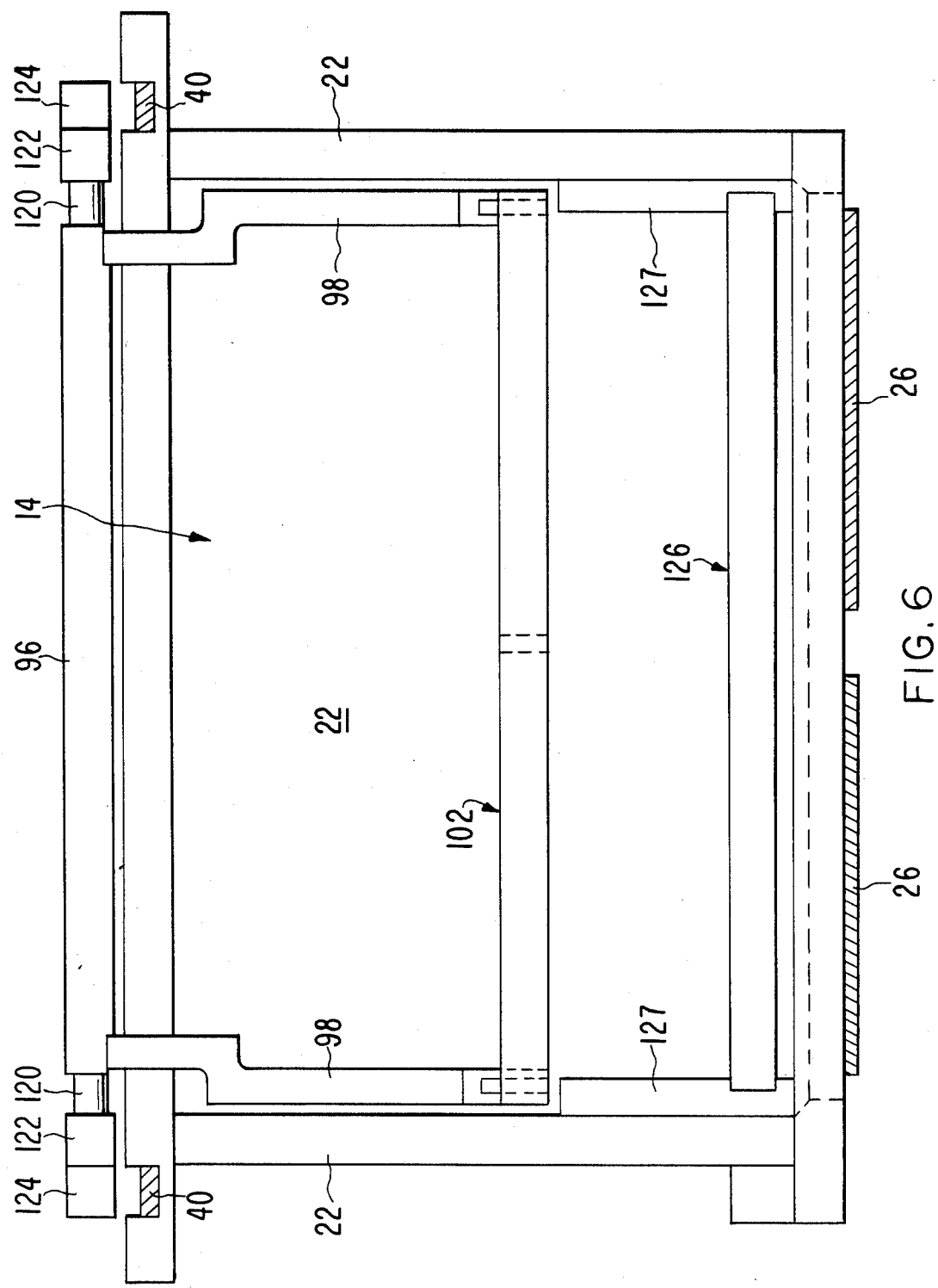

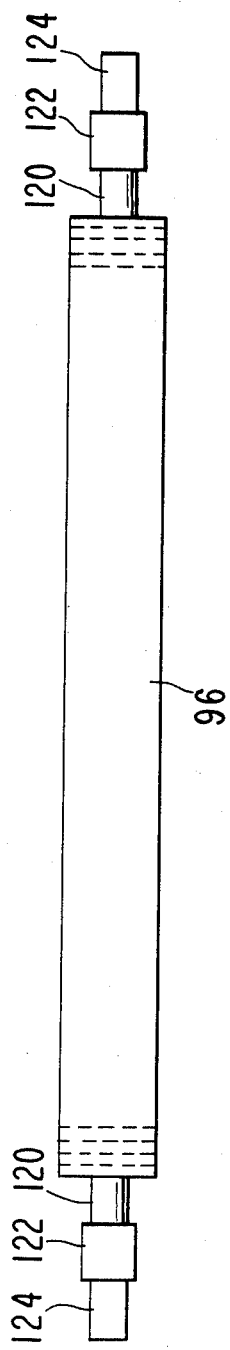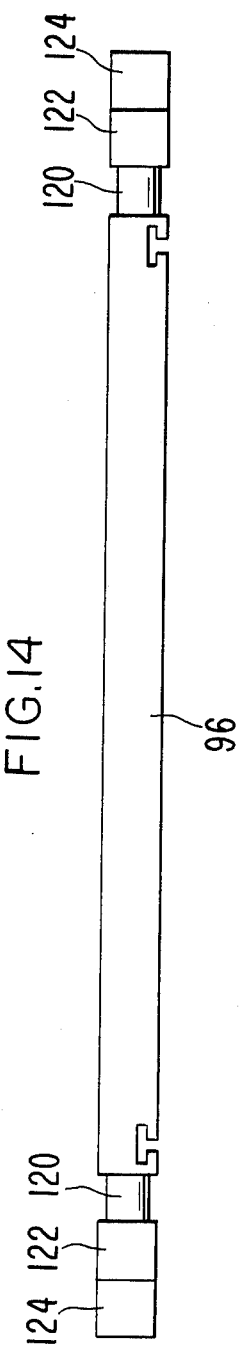

APPARATUS FOR CLEANING, RINSING AND DRYING SUBSTRATES

This is a division of application Ser. No. 832,506 filed Feb. 21, 1986, and now abandoned.

This invention relates to improvements in the handling of substrates, such as semiconductor wafers and other articles, during manufacture and, more particularly, to an apparatus and a method for removing impurities and foreign matter from the surfaces of substrates by megasonic energy and to make them ready for further processing in a clean, dry condition.

BACKGROUND OF THE INVENTION

The cleaning of semiconductor wafers and other substrates has, for a number of years, been accomplished with the use of ultrasonic energy when the wafers or substrates are immersed in a cleaning solution. Disclosures of ultrasonic cleaners of this type are found U.S. Pat. Nos. 2,760,501, 2,828,231, 2,985,003, 3,527,607 and 3,640,295. Additional disclosures covering cleaning systems using energy in the megasonic range include U.S. Pat. Nos. 3,893,869, 4,099,417, 4,118,649, 4,326,553 and 4,543,130. Japanese patent application No. 46-7105, published Mar. 12, 1971, also discloses an ultrasonic cleaning device for flat substrate members, such as semiconductor wafers.

In some of the foregoing disclosures, the substrates are flat in shape and are oriented with respect to the ultrasonic energy so that the energy will cause effective cleaning of as much of the exposed surface of each substrate as possible. While the prior art apparatus and methods for cleaning articles of this type have been satisfactory for the most part, there is still need for improvements in the cleaning of such substrates as well as improvements in the drying of the substrates. These improvements are necessary to minimize production costs, and to provide a higher degree of cleanliness and dryness of the substrates so that they will be immediately ready for further processing, all of which is to be accomplished in a minimum of process time and at minimum expense to reduce the cost of manufacture of the products formed from the substrates themselves.

SUMMARY OF THE INVENTION

The present invention satisfies the need for improvements in apparatus and method for cleaning, rinsing and drying substrates of the type described. To this end, the present invention is directed to a system for cleaning, etching or stripping substrate materials, such as semiconductor substrates in the form of silicon, gallium-arsenide, or silicon on sapphire wafers and other substrates, such as photolithographic masks, lenses, flat panel displays or other articles characterized by relatively flat surfaces which require removal of foreign materials or contaminants down to and below 1 micron in size. The present invention is designed to receive in a wet or dry condition a plurality of substrates to be processed and to deliver the processed substrates in a dry condition for subsequent processing.

Cleaning of substrates in accordance with the present invention is accomplished by the use of megasonic energy originating on the bottom of a cleaning tank containing a cleaning solution. The megasonic energy emanates from one or more transducers mounted on or near the bottom of the cleaning tank, and the energy is directed upwardly past the surfaces of the substrates in a manner such that a maximum surface area of the substrates is exposed to the energy.

After being cleaned by the megasonic energy, the substrates are lifted out of the cleaning tank and transported to a rinse tank adjacent to the cleaning tank. Such movement of the substrates is carried out by an improved robotic transfer arm mechanism. In the rinse tank, the substrates are separated from any chemical residues by being immersed in a rinsing solution and subjected to a rinsing spray. The rinse solution is typically deionized water which may be at ambient temperature but typically is at an elevated temperature, such as a temperature in the range of 22° C. to 100° C., more preferably in the range of 66° C. to 100° C. After being rinsed, the substrates are subsequently removed from the rinse solution at a slow, smooth controlled rate so that, as the substrates emerge from the rinse solution, all surfaces of the substrates will be in a dry condition, requiring no other means of drying other than the controlled removal of the substrates from the rinse solution.

The entire cleaning, rinsing and drying process can be performed in a controlled environment that can include a head casing extending from the back of the apparatus toward the front thereof. An enclosure covering the sides, top and front of the work area of the apparatus completes the physical environment which contains the apparatus of the present invention. The front of the enclosure may be provided with an access door for loading and unloading of the substrates. Environmental control may be maintained through the use of an internal, vertical-down laminar flow system of hepifiltered air in conjunction with a rear drawn exhaust system. Alternatively, the internal laminar flow system may be excluded in those cases where sufficient clean air flow can be provided by the external environment.

An important feature of the present invention is the fact that the substrates, when held by an improved substrate holder, can be tilted in such a manner that the opposed side portions of the substrates, such as disk-like semiconductor wafers, can be oriented to permit the side portions of the substrates to be more properly exposed to the collimated megasonic energy from the transducers on the bottom of the cleaning tank. In this way, a greater area of each of the substrates can be exposed to the megasonic energy than is capable with conventional equipment because the structures of conventional substrate holders interfere with and block the megasonic energy traveling toward the substrates from the transducers. By tilting the substrate holder of the present invention, less structure of the holder is in a blocking relationship to the energy emanating from the transducers. As a result, the entire surface area of each substrate is exposed to the energy and a greater degree of cleaning action is achieved. This degree of cleaning is not attainable by conventional megasonic cleaning equipment. Moreover, the method of the present invention can be carried out under computer control and can be done automatically with a minimum of operator attention.

The primary object of the present invention is to provide an improved apparatus for cleaning, rinsing and drying of substrates, especially those in the form of semiconductor wafers, wherein the apparatus is simple and rugged in construction and requires only a minimum of space and can provide a greater degree of cleaning than is attainable by conventional cleaning equipment and is under computer control to allow initially wet or dry substrates to be quickly and effectively cleaned, rinsed and dried and to emerge from the apparatus in a dry condition so as to be ready immediately for further processing.

Other objects of this invention will become apparent as the following specification progresses, reference being had to the accompanying drawings for an illustration of a preferred embodiment of the invention.

IN THE DRAWINGS

FIG. 3 is a fragmentary, top plan view of the tank portion of FIG. 2;

FIG. 4 is an enlarged end elevational view of a substrate and a substrate holder when the same are located above a number of megasonic transducers mounted on the bottom of the cleaning tank of FIGS. 2 and 3, parts being in section to illustrate details of construction;

FIG. 6 is a vertical section of the apparatus showing the tank insert for use in tilting the substrate holder;

FIG. 13 is a top plan view of the support shaft of the substrate holder of FIG. 10; and FIG. 14 is a view similar to FIG. 13 but showing the support shaft after it has been rotated through an angle of 90°.

Figure 1:
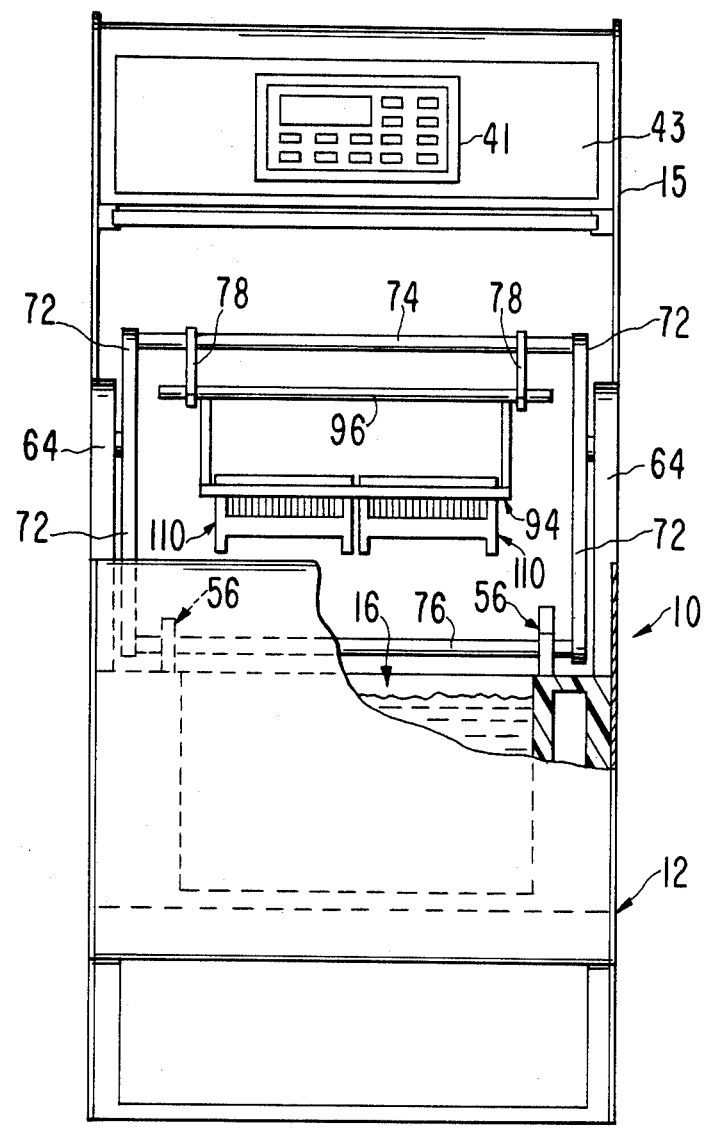
FIG. 1 is a front elevational view of the apparatus of the invention for cleaning, rinsing and drying substrates and similar articles, parts being broken away and in section to illustrate details of construction.

The apparatus of the present invention is broadly denoted by the numeral 10 and includes a cabinet or housing 12 (FIG. 2) having a cleaning tank 14 at the rear of the cabinet and a rinse tank 16 at the front of the cabinet Both tanks 14 and 16 have open tops. Cabinet 12 is adapted to be placed on a floor or other support surface.

Apparatus 10 comprises a system for cleaning, etching or stripping substrate materials of different types and sizes. For instance, such substrates can be semiconductor wafers made of silicon, gallium-arsenide, silicon-on-sapphire and the like. Other such substrate materials can include photolithographic masks, lenses, flat panel displays or other similar devices characterized by relatively flat surfaces which require removal of particle materials or contaminants down to and below 1 micron in size.

Apparatus 10 is designed to receive the substrates to be processed in a wet or dry condition and to deliver the processed substrates in a dry condition for the next processing step. Cleaning of the substrates is achieved by the use of the megasonic energy generated when a number of megasonic transducers on the bottom of cleaning tank 14 are energized. The cleaned substrates are removed from cleaning tank 14 and then deposited in rinse tank 16 in a manner hereinafter described. In the rinse tank, the substrates are cleaned of any chemical residues remaining from the processing in the cleaning tanks 14 by rinsing in deionized water which may be heated to an elevated temperature or is at ambient temperature. The substrates are removed from a final hot rinse solution in rinse tank 16 in a dry state, requiring no means of drying other than by a slow and smooth removal of the substrates from the rinse tank in a manner hereinafter described.

The entire process described immediately above is performed in a controlled environment that is formed by the use of a head casing (not shown) extending from the back margin 18 (FIG. 2) of cabinet 12 toward the front margin 20. An enclosure covers the sides, top and front of the cabinet 12. The front of the enclosure has an access door for loading and unloading of the substrates. Environmental control may be maintained by using a rear drawn exhaust system to evacuate the fumes from the cleaning solution in cleaning tank 14. Tank 14 has outlet ports 15 (FIG. 2) for allowing fumes to be drawn out of cleaning tank 14 by suction to an exhaust port coupled at the rear face of cabinet 12 to the exhaust system.

Cabinet 12 includes a number of side walls 22 (FIG. 2) and a bottom wall 24 which define cleaning tank 14. A number of megasonic transducers 26 are mounted on the bottom wall 24. The transducers are typically of the piezoelectric type and typically operate in a frequency range of 0.75 MHz to 1.5 MHz or higher. Each transducer directs megasonic energy directly upwardly through the cleaning solution in cleaning tank 14 and in cleaning relationship to substrates arranged in cleaning tank 14 in a manner hereinafter described. Means (not shown) is provided to direct a cleaning solution into the cleaning tank 14 to a predetermined level. Outlet means (not shown) is also provided to drain the cleaning tank after a predetermined period of cleaning time has elapsed as determined by the cleaning capability of the cleaning solution itself.

In the megasonic frequency range of 0.75 MHz to 1.0 MHz or higher, a continuous scrubbing action is achieved as a consequence of a controlled pressure wave in the cleaning solution as generated by the transducer array. The cleaning solution acts principally as a wetting agent to hold removed particulates in suspension and prevent their electrostatic reattachment to the substrates being cleaned.

Rinse tank 16 is formed from a number of side walls 28 (FIG. 2) and a bottom wall 30. Means 32 and 39 are provided to direct a rinse solution, such as deionized water, into the rinse tank 16 to a predetermined level as determined by slots 34 in a pair of opposed side walls 28.

The substrates, while in the rinse tank, are sprayed with the rinse solution from nozzles 37 coupled with spray bars 39 coupled with a source of the rinse solution. The slots 34 allow overflow of rinse solution into a collection plenum (not shown) at each of sides 28. Also, rinse tank 16 has a bottom outlet opening 36 for quickly dumping the rinse solution after the rinse tank has been filled by means 32 and 39 the substrates in a holder have been completely covered by the rinse solution.

In a typical operation, before each dump of the rinse solution, the rinse solution continuously flows into the rinse tank 16 through means 32 and 39 and continuously flows out of the rinse tank through slots 34. Heater means may be provided exteriorly of the rinse tank 16 to heat the rinse solution to a temperature above the ambient temperature. In the alternative, the rinse solution can be at ambient temperature if desired.

Cleaning tank 14 has a pair of flat side surface portions 38 (FIG. 2) over which respective chains 40 are movable. The chains are coupled in any suitable manner to a drive motor (not shown) below the cleaning tank, the drive motor having a drive shaft (not shown) coupled to a sprocket which drives one of the chains 40. Drive motor 42 is coupled by a cross shaft (not shown) to a second sprocket 44 for driving the other chain 40 when the first-mentioned chain is driven. The drive motor is reversible; thus, chains 40 can move together in the same direction and at the same speed.

Figure 11:
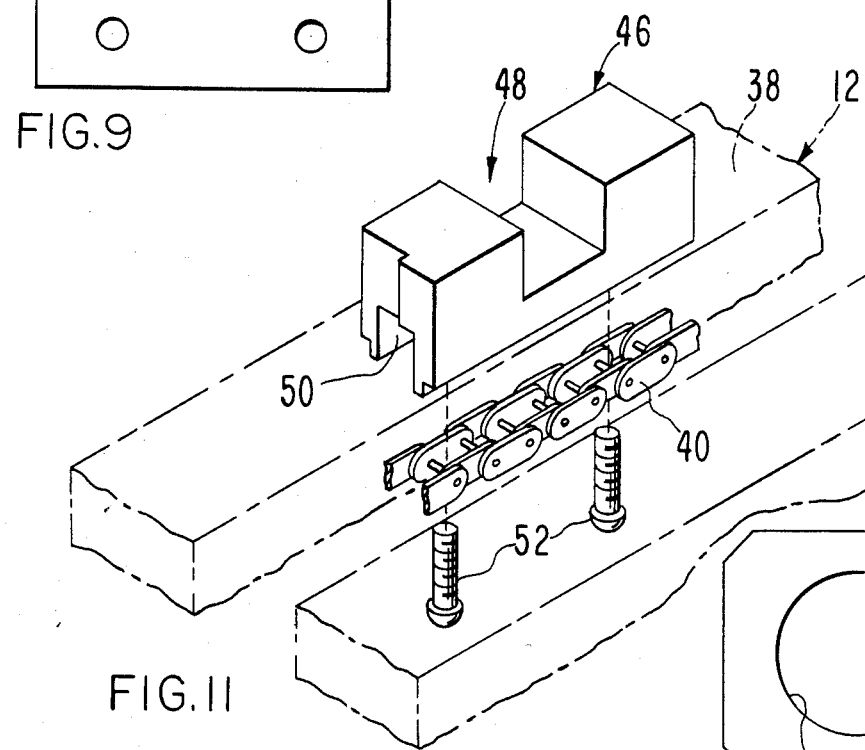
FIG. 11 is an enlarged, exploded, perspective view of a portion of the side of the cleaning tank of the invention, showing a support element or sled for supporting a respective end of the support shaft of the cassette holder of FIG. 10.

Each chain carries a support element identified as a sled 46 having the configuration as shown in FIG. 11. Each sled 46 is in the form of a block having a notch 48 in the middle thereof, the notch being open at the top and sides. Sleds 46 of chains 40 are laterally aligned with each other so that they can receive the ends of a support shaft (FIGS. 13 and 14) of a substrate holder as hereinafter described. With the shaft in notches 48, chains 40 move the sleds 46 first in one direction for a specific purpose and then in the opposite direction for another purpose. These purposes will be described hereinafter with respect to the operation of apparatus 10.

Each sled 46 is secured to the respective chain 40 in any suitable manner. For purposes of illustration, each sled 46 has a downwardly facing open bottom groove 50 which removably receives the adjacent chain 40. Screws 52 are provided to extend through chain 40 and to be threaded into the adjacent sled 46. Other means of coupling the sled to the chain can be used, if desired.

Figure 2:
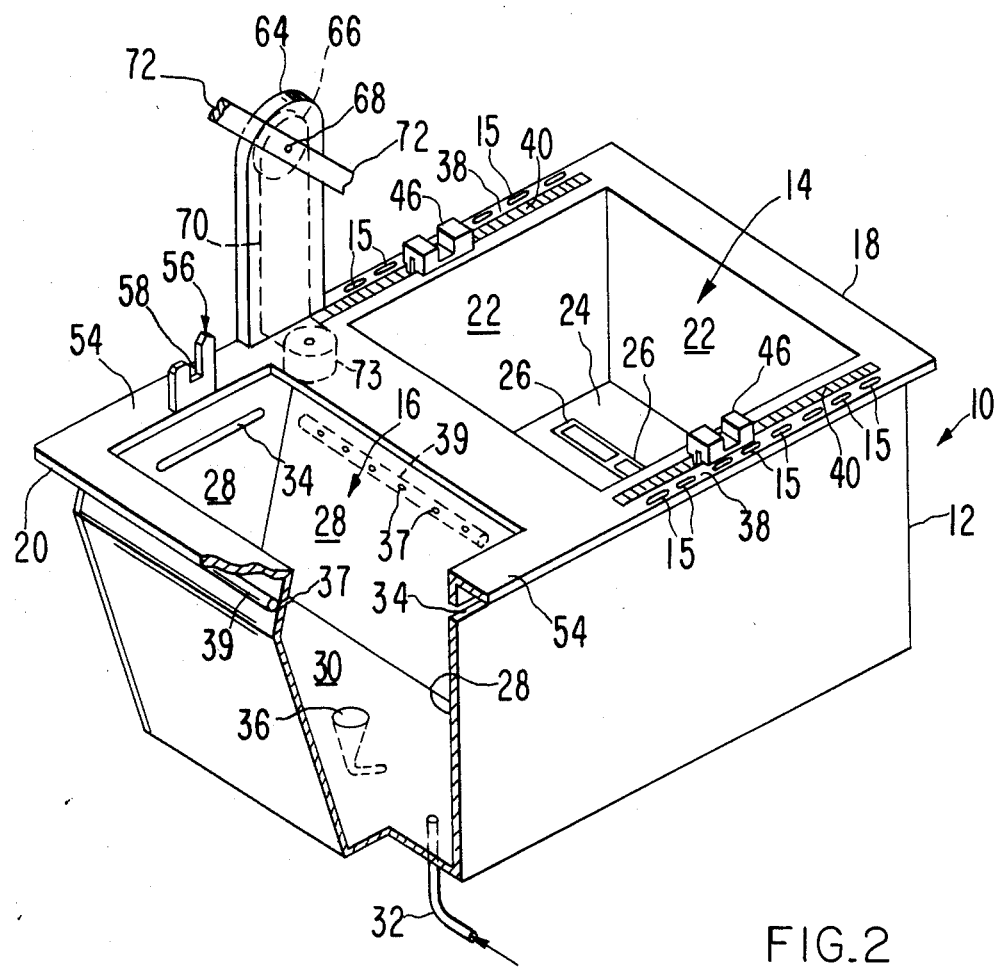
FIG. 2 is a fragmentary, perspective view of the tank portion of the apparatus of FIG. 1, showing the cleaning tank and the rinse tank adjacent to each other.

Rinse tank 16 has a pair of flat side surface portions 54 which are coextensive with side surface portions 38 adjacent to cleaning tank 14. A pair of support members 56, only one of which is shown in FIG. 2, are rigidly mounted to respective surface portions 54. Each support member 56, hereinafter called a receiver, is provided with a shaft-receiving notch. Each support member 56 is formed from a block of material and its notch 58 is laterally and horizontally aligned with the corresponding notch 58 of the support member 56 on the opposite side surface portion 54. The purpose of notches 58 is to receive respective ends of the support shaft of the above-mentioned substrate holder as hereinafter described; thus, the sleds 46 and the support members 56 perform similar functions but at different times, namely the supporting of the ends of the support shaft of the substrate holder.

An upright, hollow member 64 is mounted at each side of cabinet 12 at the junction between surface portions 38 and 54 as shown in FIG. 2, only one of which members 64 is shown. A sprocket 66 is rotatably mounted within housing 64 by a shaft 68, and the sprocket 66 is coupled by a chain 70 to a drive motor 73 carried in any suitable location in cabinet 12. Shaft 68 is also connected to an elongated, rigid bar defining a pair of arms 72 which extend radially outwardly from shaft 68. A first crosspiece 74 is coupled at first, outer ends of the arms 72 on opposite sides of cabinet 12, and a second crosspiece 76 is coupled at the outer ends of the other arms 72. Crosspiece 74 is used to support the substrate holder, and crosspiece 76 is weighted to counterbalance the weight of the substrate holder supported by crosspiece 74.

As arms 72 rotate relative to housings 64, crosspieces 74 and 76 move with arms 72 either downwardly or upwardly depending upon the direction of rotation of the arms 72 relative to cabinet 12. Normally, crosspiece 74 is above crosspiece 76. Motors 73 for the two chain and sprocket assemblies 66 and 70 are computer controlled by control means 41 (FIG. 1) mounted on panel 43 coupled with the overhead shield 15.

Figure 12:
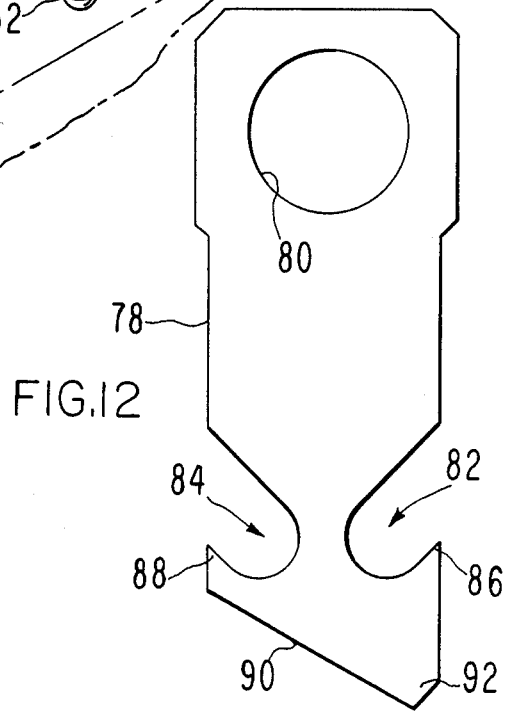
FIG. 12 is a side elevational view of a hook member pivotally carried by a crosspiece on an arm assembly for moving the substrate holder of FIG. 10 between operative positions in the cleaning tank and the rinse tank.

Crosspiece 74 is provided with a pair of spaced hook members 78 as shown in FIGS. 1 and 12. Each hook member 78 is provided with a hole 80 which rotatably receives crosspiece 74. Each hook member 78 has a front recess 82 and a rear recess 84, recess 82 being adjacent to a hook lip 86 to form a front hook and recess 84 being adjacent to a lip 88 to form a rear hook. An inclined surface 90 extends downwardly from lip 88 to a location 92 below lip 86. Recesses 82 and 84 are adapted to removably receive respective end portions of the support shaft of the substrate holder of the type hereinafter described.

Figure 10:
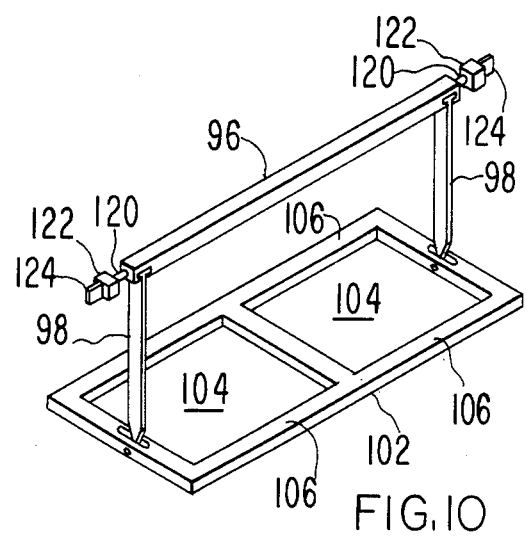
FIG. 10 is a perspective view on a reduced scale of a substrate holder of the present invention.
Figure 9:
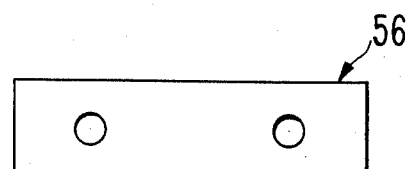
FIG. 9 is a bottom plan view of the receiver of FIG. 8.

Substrate holder 94 as shown in FIG. 10 includes a support shaft 96 rigidly secured to a pair of legs 98 which are pivotally mounted by pins 100 on a frame 102 having a pair of openings between legs 98 and surrounded by flat surface portions 106 of the frame. The pivotal connection between legs 98 and frame 102 allows the frame to pivot relative to support shaft 96 for a purpose hereinafter described when the support shaft is supported at its ends in recesses 48 of sleds 46 (FIG. 11).

Holder 94 is adapted to receive and support one or more devices for containing substrates. These devices generally can be considered to be cassettes, boats, carriers and the like but will hereinafter be described as cassettes. Cassettes of the type used with holder 94 may be conventional in construction and of the type in which flat substrates, such as semiconductor wafers, are held in relatively fixed positions in a parallel arrangement with the wafers being in generally vertical planes. The substrates are typically held in place by grooves or slots in the cassettes which physically restrain the substrates by their edges maintaining minimal contact with the flat working faces of the substrates.

For purposes of illustration, flat substrate 108 is shown in FIG. 4 in a cassette 110 having an open top and an open bottom to allow a significant area of each substrate 108 to be exposed to the energy of the megasonic transducers 26 in the cleaning tank. As shown in FIG. 4, each cassette has a lower, inclined rib 112 which supports each substrate 108, respectively. Moreover, a pair of cassettes removably fit neatly into respective openings 104 (FIG. 10) of holder 94. To achieve this fit, the side flanges 114 on each cassette engage and are supported by the flat upper surfaces 106 of frame 102 of substrate holder 94.

Support shaft 96 has a generally flat cross section throughout its major extent as shown in FIGS. 13 and 14. Near each outer end of support shaft 96, a first, cylindrical segment 120 is provided for removable insertion into either of recesses 82 and 84 of a respective support leg 78 depending from crosspiece 74 (FIG. 1.) (FIG. 12).

Figure 8:
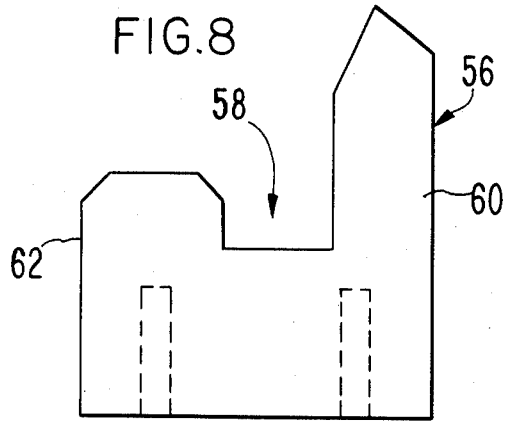
FIG. 8 is a side elevational view of a support member or receiver adapted to be placed at each side, respectively, of the rinse tank for removably receiving a respective end of the support shaft or handle of the substrate holder.

Next to segment 120 is a generally square segment 122 which is removably receivable in the recess 58 of the adjacent receiver 56 (FIG. 8) when the shaft 96 extends above the rinse tank 16. Finally, an outer, rectangular segment 124 is integral with the outer face of segment 122 and is adapted to be removably received within a recess 48 of a respective sled 46 when shaft 96 is placed above cleaning tank 14 as hereinafter described.

Figure 5:
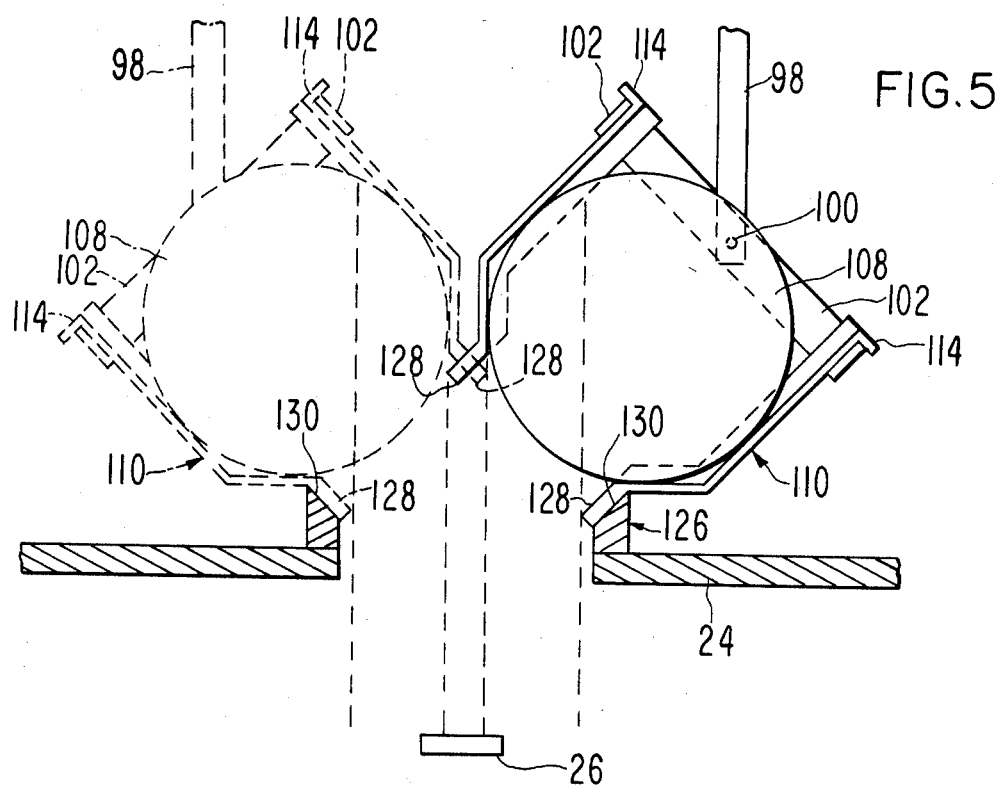
FIG. 5 is a view similar to FIG. 4 but illustrating the way in which the substrate holder is tilted to expose a greater surface area of the substrates in the holder to the radiation from the transducer therebelow.

A tank insert or frame 126 (FIGS. 4, 6 and 7) is provided to allow tilting of substrate holder 94 to more properly present the side margins of the substrates to the propagated megasonic energy radiating from the transducers 26. The tilting action occurs when the cassette 110 and the substrates 108 contained thereby are held below the level of the cleaning solution in cleaning tank 14. FIG. 5 shows in full lines that frame 102 is tilted about its pivot pins 100 when one of a pair of legs 128 on the corresponding cassette engages an inclined side surface 130 of bracket 126 (FIG. 4). In such a case, the lefthand side marginal areas of each substrate 108 will be more clearly exposed to the megasonic radiation from the transducers 26. Without such exposure, the substrates 108 would not properly be cleaned. FIG. 5 also shows in dashed lines the cassette tilted in the opposite direction when the other leg 128 of the cassette engages the opposite inclined face 130 of frame bracket 126. In this position of the cassette, the opposite side marginal areas of each substrate 108 will be more cleanly exposed to the megasonic radiation.

Figure 7:
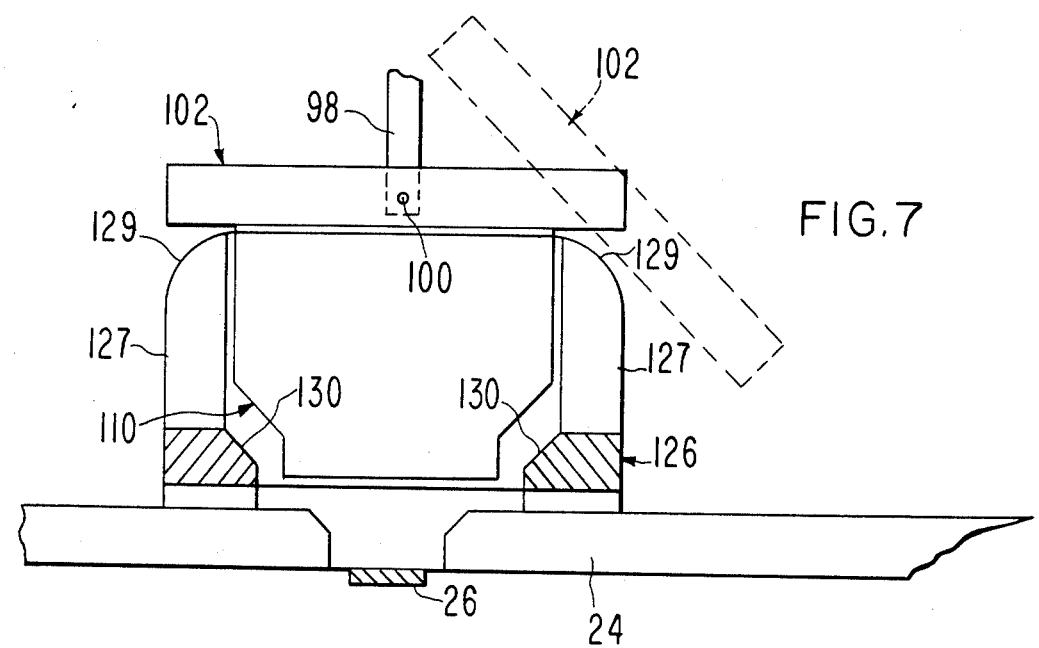
FIG. 7 is a schematic end elevational view of the tank insert of FIG. 6 showing the upper camming surfaces at the ends of the tank insert for re-aligning the substrate holder after it has been tilted and is returning to its initial upright position.

FIGS. 6 and 7 show that frame 126 has a pair of spaced, parallel end pieces 127 which extend upwardly from the respective end of the frame. Each end piece 127 has a convex upper end surface for engaging and camming the substrate holder 102 as shown in dashed lines in FIG. 7. This feature realigns the substrate holder as it traverses tank 14. The convex upper end surface of each end piece 127 causes the substrate holder to return to a position substantially parallel to the tank bottom.

OPERATION

To place apparatus 10 in condition for operation, a cleaning solution is placed in cleaning tank 14 to a predetermined level, and a rinse solution is placed in rinse tank 16 to the level of slots 34, whereby the rinse solution will overflow and go into a waste disposal as new rinse fluid continuously is directed into tank 16 by means 32 and 39.

One or a pair of cassettes 110 filled with substrates 108, such as semiconductor wafers, are placed in substrate holder 94 when the holder is in a position substantially the same as that shown in FIG. 1 with crosspiece 74 near the upper extremity of its path of travel and with hook members 78 supporting shaft 96 of substrate holder 94 above the rinse solution. To achieve this, segments 120 (FIGS. 13 and 14) of support shaft 96 are manually placed within the front recess 82 (FIG. 12) of hook members 78.

With the substrate holder 94 loaded, computer control causes drive motors 73 (FIG. 2) to be energized to rotate arms 72 in a direction to move the substrate holder to a position overlying cleaning tank 14. The movement of the holder 94 continues until the segments 124 (FIGS. 13 and 14) of support shaft 96 are removably received within the recesses 48 (FIG. 11) of sleds 46 on opposite sides of the cleaning tank 14.

When segments 124 are seated in recesses 48 of sleds 46, the substrate holder 94 is generally centered over the megasonic transducers 26. This is the configuration of substrate holder 94 as shown in FIG. 4.

Computer control of power to transducers 26 causes megasonic radiation to be propagated vertically upwardly in cleaning relationship to the substrate 108 held in cassettes 110 and suspended by holder 94 as shown in FIG. 4.

If the substrates 108 are large enough, it is probable that some of the surface area of the substrates will not be exposed to the megasonic energy from transducers 26 because the bottom of the holder will be in a position to block such energy. In such a case, it may be necessary to tilt frame 102 of holder 94 in the manner shown in FIG. 5. Because of the collimated nature of megasonic energy and the fact that a solid mass will block further propagation of the megasonic energy field, it is necessary to provide the maximum exposure of the substrate surfaces to be cleaned to the megasonic energy. This is accomplished when holder 94 is tilted first in one direction as shown in full lines in FIG. 5, and then in the opposite direction, shown in dashed lines in FIG. 5. The tilted positions of the holder 94 exposes the side margins of the substrates as described above. When the substrates in their holder are tilted, these side margins are fully exposed to the energy from the transducers 26 and the substrates are effectively cleaned.

To achieve the tilting of the substrates first in one direction, and then in the opposite direction, the drive motor (not shown), coupled with the chains 40, is actuated to move the chains and thereby sleds 46 forwardly in one direction through a predetermined distance, such as one to three inches. After the first inch of travel, for instance, the corresponding legs 128 of the cassettes 110 eventually engage inclined surface 130 of bracket 126 on bottom 24 of tank 14. Further movement of the holder 94 causes the holder 94 to tilt to the right when viewing FIG. 5. Thus, the lefthand marginal areas of the substrates are exposed and cleaned.

The chain motor (not shown) causes chains 40 to move in the opposite directions or rearwardly until the other legs 128 of the cassettes 110 engage the rear inclined surface 130 of frame bracket 126. Then, as shown in FIG. 5, the righthand side marginal areas of substrates 108 are exposed and cleaned. After cleaning of the right side margins of the substrates, the substrate holder is returned to its initial or equilibrium position midway between inclined surfaces 130 as shown in FIG. 4. These steps can be repeated one or more times, as desired.

The distance through which chains 40 move is generally determined by the sizes of the substrates. For instance, for substrates having a diameter of 3 inches, the distance is typically 5 inches. For a diameter of 4 inches, the distance traveled typically is 4 inches and so on.

During all of this cleaning time, shaft 96 is coupled to sleds 46 and hook members 78 are not connected in any way to shaft 96. In fact, crosspiece 74 is preferably near the upper extremity of its path of travel after hook members 78 have been separated from support shaft 96 and have been moved following the placement of segments 124 of shaft 96 in recesses 48 of sleds 46.

After a predetermined cleaning time, such as 10 to 15 minutes, motors 73 are again energized to rotate respective arms 72 until hook members 78 again are in positions for receiving segment 120 of support shaft 96. The hook members 78 move downwardly behind support shaft 96, until segments 120 of support shaft 96 are horizontally aligned with the open upper ends of front recesses 82 of hook members 78 (FIG. 12). The reversal of chains 40 then causes the segments 120 of support shaft 96 to move rearwardly and partially into hook recesses 82. When this has occurred, the motors 73 reverse, causing crosspiece 74 and hook members 78 to be lifted so that the hook members become connected with segments 120 because the segments automatically move completely into recesses 82 of hook members 78.

Motors 73 continue to cause rotation of arms 72 until crosspiece 74 moves upwardly, over and downwardly toward the open top of rinse tank 16. The lowering of crosspiece 74 lowers the substrate 94 until segments 122 of support shaft 96 enter the recesses 58 of receivers 56. When this occurs, the substrates 108 are below the level of the rinse solution in rinse tank 16.

While the substrates are in rinse tank 16, the rinse solution removes any process chemical residues held on the surfaces of the substrates as a result of being in the cleaning tank 14. Rinse solution is quickly dumped from rinse tank 16 one or more times through opening 36 (FIG. 2). Also, rinse solution can be sprayed from spray bars 39 one or more times while tank 16 is being filled with solution.

Following the rinse step, the arms 72 are again rotated so that crosspiece 74 moves forwardly and downwardly with hook member 78 being carried by the crosspiece 74. The hook members 78 move downwardly until angle faces 90 contact segments 120 of support shaft 96. Because of the angle on each face 90, each hook member 78 rotates on its mounting hole 80 on crosspiece 74 forwardly while hook members 78 are being moved downwardly. This forward and downward movement continues until the rear access 84 of hook member 78 drops down onto and engages with segments 120 of support shaft 96. Upon reversal of the motion of the arms 72, the substrates 108 are lifted out of the rinse solution.

The rate at which the substrates are lifted out of the rinse solution is selected so that drying of the substrates and cassettes occurs in the following manner and without blowing heated air over the substrates. To this end, the substrates are moved upwardly and out of the rinse tank at an extremely slow rate which can be varied, if desired. Typically, the rate of ascent of the substrates to achieve total removal from the rinse solution will require 1 minute to 15 minutes or more when the temperature range of the rinse solution is 25° C. to 100° C. The arms 72 remove the substrate holder from the rinse tank by rotating crosspiece 74 upwardly toward the top of its path of travel. The hook members 78 will lift the substrate holders up and out of the receivers 56 and rinse tank 16.

Normally, the rinse solution is deionized water at a temperature between 60° and 100° centigrade. During removal of the substrates from the rinse tank, the rinse solution is continuously supplied at the bottom of the tank, displacing the solution at the surface which flows out of the tank through slots 34 (FIG. 2). As this rinse solution is supplied at a constant elevated temperature, it functions to maintain the temperature of the rinse solution during the removal process. At elevated temperatures, two phenomena occur which allow the substrates to be removed without any water being removed from the rinse tank solution.

This is explained as follows:

Each substrate will be hotter than ambient due to absorption of heat energy from the rinse solution if the latter is heated. The hot surfaces of each substrate will then cause any molecules of the aqueous rinse solution that are in contact with the substrate to experience an increase of the potential energy within the structure of that molecule according to the first law of thermodynamics. An increase of energy stored within the molecule is dissipated according to the second law of thermodynamics through an increase in the kinetic energy of the constituent atoms of the molecule. The enthalpy associated with this increased kinetic energy is greater than the enthalpy of the aggregate of aqueous molecules bonded to the substrate surface as defined by the coefficient of surface tension. Specifically, this results in a decreased ability of the weakly polar water molecules to form polar bonds with the surface of the substrate, thereby lowering the surface tension at the interface of the solid substrate and the aqueous solution. Thus, the water molecules are dissociated back into the body of the rinse solution due to the greater attraction of the cumulative charges of molecules of rinse solution at the surface of the rinse solution which is cooler and demonstrates intermolecular cohesion because of lower kinetic energy, minimum enthalpy and maximum entropy, i.e, by way of surface tension effects.

Assisting in this process, the most common cleaning solution used in megasonic cleaning of, for example, silicon wafers, is Standard Clean-1 or SC-1 (a solution consisting typically of 1:1:5 mixture by volume of semiconductor grade ammonium hydroxide, hydrogen peroxide and deionized water). This solution functions as a surfactant solution in the megasonic cleaning phase of the overall process. The substrates thus cleaned are left with a significantly hydrophilic character to their surfaces. Such a surface characteristic on the surface allows a shield of water molecules to form between the substrate and the particulate contaminants which are contained in the surfactant solution. Upon immersion of the wafers into heated deionized water, this hydrophilic character is lost along with any particulates which may have formed weak adhesive bonds with the water molecules shielding the wafer surface and are flushed away during the rinsing process. Other solutions may be similarly used to facilitate stripping or etching of the substrates.

The net effect is that, as the cassettes and substrates 108 therein are removed from the heated rinse solution, those water molecules which are in closest proximity to their outer surfaces will seek a level of greater molecular stability (by way of the second law of thermodynamics) by forming preferential polar bonds with other water molecules in the solution. Thus, the substrates emerge from the rinse solution without any water molecules adhering to any of their outer surfaces.

After the substrates have been lifted completely out of the rinse solution, the holder can be manually removed from the hook members 78. The substrates are then ready for further processing.

In making parts for apparatus 10, one or a combination of plastics can be used throughout the apparatus for cleanliness, chemical resistance and lubricity whenever a self-lubricating bearing surface is required, as in the case of hook members 78. Such plastics may include Teflon, polypropylene, PVDF and others.

In order to maintain a controlled environment for the process, the work area is enclosed completely. This enclosure assists in channeling the flow of exhausted air and process gases from the work and access areas. Exhaust is supplied from an external source. Laminar air may be supplied from an internal or external source. In an external environment which duplicates the internal control environment, such as in an automated Class-10 semiconductor clean room facility the system's environment enclosure may be dispensed with.

While the cleaning and rinse tanks 14 and 16 have been described above as being used in combination with movable arms 72, it is possible to form and use a subcombination of elements including the cleaning tank and the means for tilting the substrate holder as shown in FIGS. 4–7. Another subcombination could be the rinse tank and movable arms 72, both subcombinations being computer controlled.

Another way of presenting the substrate to the energy field of the megasonic transducers 26 is to provide a means in the cleaning tank 14 for rotating the wafers 208 in and relative to the cassette 110 which holds the substrates. As the cassette is lowered into the cleaning solution in tank 14, the lower open end of the cassette will expose the lower marginal edges of the substrates carried by the cassette, and these lower peripheral edges will engage and be supported on a pair of spaced, horizontal, parallel rods or shafts which would be mounted in some suitable manner for rotation relative to the cleaning tank and to the cassette holding the substrates.

As the cassette is lowered into the cleaning solution, the two parallel shafts, which are of lengths less than the length of the cassette, will allow the substrates to be slightly lifted by the shafts, such as through a distance of one-fourth inch or less so that the substrates will effectively be free to rotate in their slots in the cassettes under the influence of the rotation of the two shafts which are in frictional engagement with the lower peripheral edges of the substrates. Some suitable drive means is coupled to both shafts so that the shafts can rotate in the same direction to, in turn, rotate the substrates, whereby the entire surface areas of both sides of the substrates can be exposed to the megasonic energy field generated by one of the megasonic transducers 26 on the bottom of the tank.

We claim:

1. Apparatus for handling substrates comprising:
   means defining a cleaning tank for containing a cleaning solution;
   a holder for supporting a number of substrates in the cleaning tank;
   at least one megasonic transducer in the cleaning tank on the bottom surface thereof, said transducer being adapted for directing a collimated beam of megasonic energy upwardly through the cleaning solution past the substrates when the substrates are supported by said substrate holder in the cleaning solution; and
   means coupled with the cleaning tank defining means for moving the substrate holder along a rectilinear path and into a tilted position at the end of said path to present a greater surface area of the substrates to the megasonic energy when the substrates are in th cleaning solution.

2. Apparatus as set forth in claim 1, wherein is included an arm assembly for moving the substrate holder into and out of the cleaning tank, said arm assembly including a crosspiece provided with a pair of spaced, depending hook members thereon, said substrate holder having a generally horizontal support shaft having a pair of ends adapted to be removably coupled to respective hook members.

3. Apparatus as set forth in claim 2, wherein is included means for receiving and supporting the ends of the support shaft of the substrate holder and for moving the substrate holder laterally and away from the hook members to separate the support shaft from the hook members when the substrate holder is in the cleaning tank.

4. Apparatus for handling substrates comprising:
   means defining a cleaning tank for containing a cleaning solution;
   a holder for supporting a number of substrates in the cleaning tank, said holder having a pair of relatively shiftable parts;
   at least one megasonic transducer in the cleaning tank on the bottom surface thereof, said transducer being adapted for directing a collimated beam of megasonic energy upwardly through the cleaning solution past the substrates when the substrates are supported by said substrate holder in the cleaning solution; and
   means coupled with the cleaning tank defining means for tilting the substrates to present a greater surface area of the substrates to the megasonic energy when the substrates are in the cleaning solution, said tilting means including abutment means in the cleaning tank for engaging one of the parts of the holder to cause shifting of the substrate holder into a first inclined position to expose one side portion of each substrate to the megasonic energy and into a second inclined position to expose the opposite side portion of each substrate to the megasonic energy.

5. Apparatus as set forth in claim 4, wherein said abutment means includes a pair of spaced abutments on the bottom of the cleaning tank on opposite sides of said transducer.

6. Apparatus as set forth in claim 5, wherein said tilting means includes means for moving the holder through a distance along a horizontal path, said one part of the holder being engageable alternately with said abutments.

7. Apparatus for handling substrates comprising:
   means defining a cleaning tank for containing a cleaning solution;
   a holder for supporting a number of substrates in the cleaning tank, said holder including a generally horizontal support shaft;
   at least one megasonic trasducer in the cleaning tank on the bottom surface thereof, said transducer being adapted for directing a collimated beam of megasonic energy upwardly through the cleaning solution past the substrate when the substrates are supported by said substrate holder in the cleaning solution; and
   means coupled with the cleaning tank defining means for tilting the substrate to present a greater surface area of the substrates to the megasonic energy when the substrates are in the cleaning solution, said tilting means including chain means adapted to be coupled with the substrate holder for moving the same relative to and within the cleaning tank in opposed directions, said chain means tank, each chain having a coupling element thereon and movable therewith, each coupling element having a recess with an open top and an open side, said support shaft being removably received at each end thereof in the recess of each coupling element, respectively, for moving the substrate holder in response to the movements of the chains, and means coupled with the chains for moving the same together in opposed directions.

* * * * *